United States Patent
Okamoto et al.

(10) Patent No.: US 9,842,856 B2
(45) Date of Patent: Dec. 12, 2017

(54) SEMICONDUCTOR MEMORY DEVICE AND METHOD OF MANUFACTURING THE SAME

(71) Applicant: TOSHIBA MEMORY CORPORATION, Minato-ku (JP)

(72) Inventors: Tatsuya Okamoto, Inabe (JP); Tatsufumi Hamada, Yokkaichi (JP)

(73) Assignee: TOSHIBA MEMORY CORPORATION, Minato-ku (JP)

(*) Notice: Subject to any disclaimer, the term of this patent is extended or adjusted under 35 U.S.C. 154(b) by 0 days.

(21) Appl. No.: 15/251,438

(22) Filed: Aug. 30, 2016

(65) Prior Publication Data
US 2017/0263626 A1    Sep. 14, 2017

Related U.S. Application Data

(60) Provisional application No. 62/305,584, filed on Mar. 9, 2016.

(51) Int. Cl.
*H01L 27/115* (2017.01)
*H01L 27/11582* (2017.01)
(Continued)

(52) U.S. Cl.
CPC .... *H01L 27/11582* (2013.01); *H01L 23/5283* (2013.01); *H01L 27/11556* (2013.01); *H01L 29/401* (2013.01)

(58) Field of Classification Search
CPC .......... H01L 23/5283; H01L 27/11556; H01L 29/401; H01L 27/11563–27/11582;
(Continued)

(56) References Cited

U.S. PATENT DOCUMENTS 8,072,024 B2 * 12/2011 Ishikawa ........... H01L 21/28282
257/296
8,653,582 B2 * 2/2014 Fukuzumi ......... H01L 27/11578
257/324
(Continued)

FOREIGN PATENT DOCUMENTS

JP      2012-119445     6/2012
JP      2014-33201      2/2014
JP      2014-57067      3/2014

*Primary Examiner* — Scott B Geyer
(74) *Attorney, Agent, or Firm* — Oblone, McClelland, Maier & Neustadt, L.L.P.

(57) ABSTRACT

According to an embodiment, a semiconductor memory device comprises: a plurality of control gate electrodes stacked above a substrate; a first semiconductor layer extending in a first direction above the substrate and facing the plurality of control gate electrodes; a gate insulating layer extending in the first direction and provided between the control gate electrode and first semiconductor layer; and a second semiconductor layer positioned downwardly of the first semiconductor layer and gate insulating layer, and connected to a lower end of the first semiconductor layer and the substrate. Moreover, the first semiconductor layer comprises: a first portion contacting an upper surface of the second semiconductor layer at a position more downward than a lower end of the gate insulating layer; and a second portion connected to an upper end of the first portion, extending in the first direction, and having a different crystalline structure from the first portion.

8 Claims, 13 Drawing Sheets

(51) Int. Cl.
*H01L 27/11556* (2017.01)
*H01L 29/40* (2006.01)
*H01L 23/528* (2006.01)

(58) Field of Classification Search
CPC .......................... H01L 29/792–29/7926; H01L 29/4234–29/42352
See application file for complete search history.

(56) References Cited

U.S. PATENT DOCUMENTS

| | | | |
|---|---|---|---|
| 9,478,495 B1* | 10/2016 | Pachamuthu | H01L 23/53223 |
| 2012/0132981 A1 | 5/2012 | Imamura et al. | |
| 2013/0134492 A1 | 5/2013 | Yang et al. | |
| 2014/0035026 A1 | 2/2014 | Jang et al. | |
| 2014/0070302 A1 | 3/2014 | Yoo et al. | |
| 2015/0318301 A1* | 11/2015 | Lee | H01L 29/7926 257/324 |

\* cited by examiner

SEMICONDUCTOR MEMORY DEVICE AND METHOD OF MANUFACTURING THE SAME

CROSS-REFERENCE TO RELATED APPLICATIONS

This application is based upon and claims the benefit of U.S. Provisional Patent Application No. 62/305,584, filed on Mar. 9, 2016, the entire contents of which are incorporated herein by reference.

BACKGROUND

Field

Embodiments described herein relate to a semiconductor memory device and a method of manufacturing the same.

Description of the Related Art

A flash memory that stores data by accumulating a charge in a charge accumulation layer, is known. Such a flash memory is connected by a variety of systems such as NAND type or NOR type, and configures a semiconductor memory device. In recent years, a semiconductor memory device in which memory cells are disposed three-dimensionally (three-dimensional type semiconductor memory device) has been proposed to raise integration level.

DETAILED DESCRIPTION

A semiconductor memory device according to an embodiment comprises: a plurality of control gate electrodes stacked above a substrate; a first semiconductor layer extending in a first direction above the substrate, the first semiconductor layer facing the plurality of control gate electrodes; a gate insulating layer extending in the first direction and provided between the control gate electrode and the first semiconductor layer; and a second semiconductor layer positioned downwardly of the first semiconductor layer and the gate insulating layer, the second semiconductor layer being connected to a lower end of the first semiconductor layer and the substrate. Moreover, the first semiconductor layer comprises: a first portion contacting an upper surface of the second semiconductor layer at a position more downward than a lower end of the gate insulating layer; and a second portion which is connected to an upper end of the first portion, extends in the first direction, and has a crystalline structure different from that of the first portion.

Next, nonvolatile semiconductor memory devices according to embodiments will be described in detail with reference to the drawings. Note that these embodiments are merely examples, and are not shown with the intention of limiting the present invention.

For example, the nonvolatile semiconductor memory devices described below comprise a plurality of memory cells arranged in a first direction above a substrate. These plurality of memory cells are each a MONOS (Metal-Oxide-Nitride-Oxide-Semiconductor) type memory cell (memory transistor) that includes: a first semiconductor layer extending in the above-described first direction and functioning as a channel body; and a control gate electrode made of a metal provided, via a charge accumulation layer, on a side surface of the first semiconductor layer. However, this also is not intended to limit the present invention. For example, the above-described memory cells may each be a SONOS (Semiconductor-Oxide-Nitride-Oxide-Semiconductor) type memory cell that includes a control gate electrode made of a semiconductor, or may each be a floating gate type memory cell.

As an example of a nonvolatile semiconductor memory device having a floating gate type memory cell, refer to U.S. patent application Ser. No. 13/112,345 whose disclosure content is herewith incorporated by this reference.

First Embodiment

[Semiconductor Memory Device]

Figure 1:
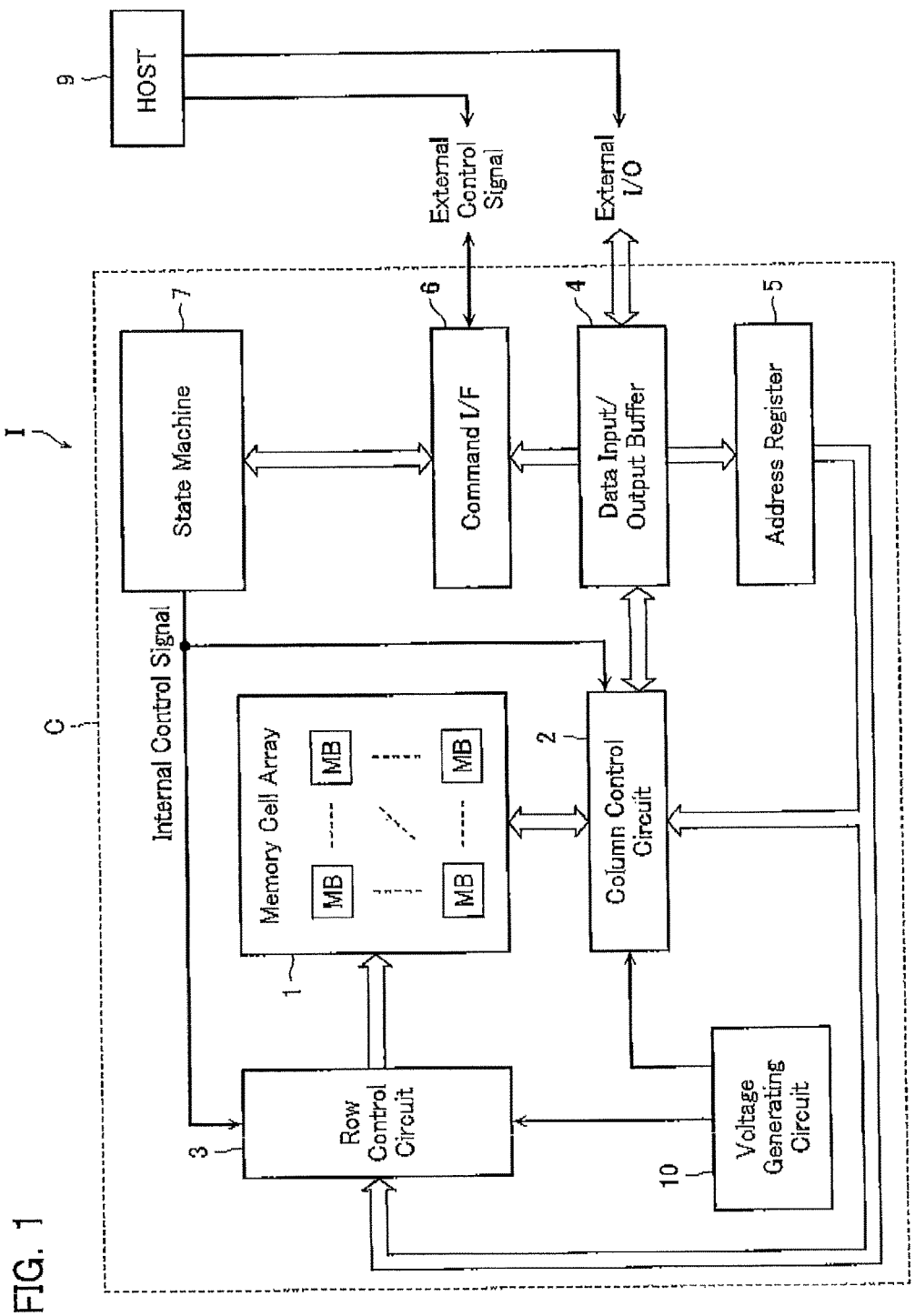
FIG. 1 is a block diagram of a nonvolatile semiconductor memory device according to a first embodiment.

FIG. 1 is a block diagram of a nonvolatile semiconductor memory device according to a first embodiment. Note that the nonvolatile semiconductor memory device referred to herein means, for example, the likes of a chip C storing user data or an electronic device I (for example, a smartphone, a mobile phone, a tablet terminal, a music player, a wearable terminal, and so on) installed with this chip C. Moreover, user data refers to, for example, data expressing contents (a character string, a sound, an image, a moving picture, and so on) utilized by a user, and is expressed by a combination of "0"s and "1"s.

The electronic device I comprises the chip C and a host 9 controlling this chip C. The chip C comprises: a memory cell array 1; and a column control circuit 2, a row control circuit 3, a data input/output buffer 4, an address register 5, a command interface 6, a state machine 7, and a voltage generating circuit 10 that control this memory cell array 1. The memory cell array 1 comprises a plurality of memory blocks MB. These memory blocks MB each record user data. The column control circuit 2 comprises an unillustrated sense amplifier, and performs read of user data, and so on. Moreover, the column control circuit 2, when performing write of user data, transfers a voltage to the memory cell array 1, according to inputted user data. The row control circuit 3 specifies a position for performing read or write of user data in the memory cell array 1, according to inputted address data. The data input/output buffer 4 performs input/output control of user data, address data, and command data. The address register 5 stores address data and supplies the address data to the column control circuit 2 and the row control circuit 3. The state machine 7 receives an external control signal from the host 9, via the command interface 6, and inputs an internal control signal to the column control circuit 2 and the row control circuit 3. The voltage generating circuit 10 generates a voltage and supplies the voltage to the column control circuit 2 and the row control circuit 3.

Figure 2:
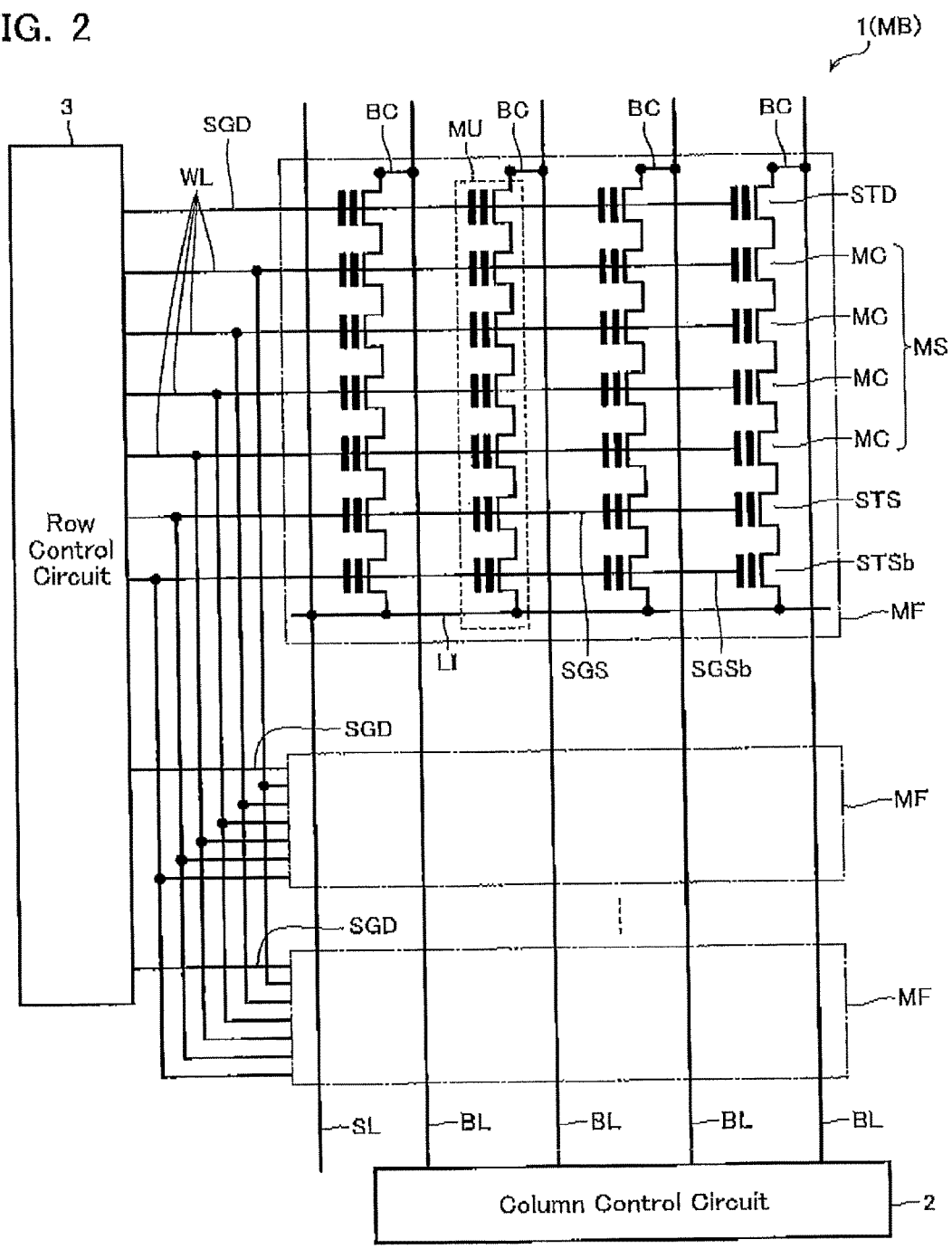
FIG. 2 is a circuit diagram showing a configuration of part of the same nonvolatile semiconductor memory device.

FIG. 2 is an equivalent circuit diagram showing a configuration of the memory block MB configuring the memory cell array 1. The memory block MB is connected to the column control circuit 2 via a bit line BL, to the row control circuit 3 via a word line WL, and to an unillustrated source line driver via a source line SL.

The memory block MB comprises a plurality of memory fingers MF. The memory finger MF comprises a plurality of memory units MU. One ends of these plurality of memory units MU are each connected to one of the bit lines BL via a bit line contact BC. Moreover, the other ends of these plurality of memory units MU are each connected to the source line SL via a common source contact LI. The memory unit MU comprises a drain side select gate transistor STD, a memory string MS, a source side select gate transistor STS, and a lowermost layer source side select gate transistor STSb that are connected in series between the bit line contact BC and the source contact LI.

The memory string MS comprises a plurality of memory cells MC connected in series. The memory cell MC is a field effect transistor that comprises: a semiconductor layer functioning as a channel body; a gate insulating layer capable of accumulating a charge; and a control gate electrode, and stores a one-bit portion or a multiple-bit portion of data configuring user data. A threshold voltage of the memory cell MC changes according to a charge amount in the gate insulating layer. Note that the control gate electrodes of the plurality of memory cells MC belonging to an identical memory string MS are respectively connected to the word lines WL. The word line WL is provided commonly for all of the memory strings MS in the memory block MB.

The drain side select gate transistor STD, the source side select gate transistor STS, and the lowermost layer source side select gate transistor STSb are field effect transistors that comprise: a semiconductor layer functioning as a channel body; and a control gate electrode. Connected to the plurality of drain side select gate transistors STD belonging to an identical memory finger MF is a common drain side select gate line SGD. Moreover, respectively connected to the control gate electrodes of the pluralities of source side select gate transistors STS and lowermost layer source side select gate transistors STSb belonging to an identical memory block MB are a common source side select gate line SGS and a common lowermost layer source side select gate line SGSb.

Note that in the description below, the lowermost layer source side select gate transistor STSb, the source side select gate transistor STS, and the drain side select gate transistor STD will sometimes simply be called select gate transistors (STSb, STS, and STD). Moreover, the lowermost layer source side select gate line SGSb, the source side select gate line SGS, and the drain side select gate line SGD will sometimes simply be called select gate lines (SGSb, SGS, and SGD).

Figure 3:
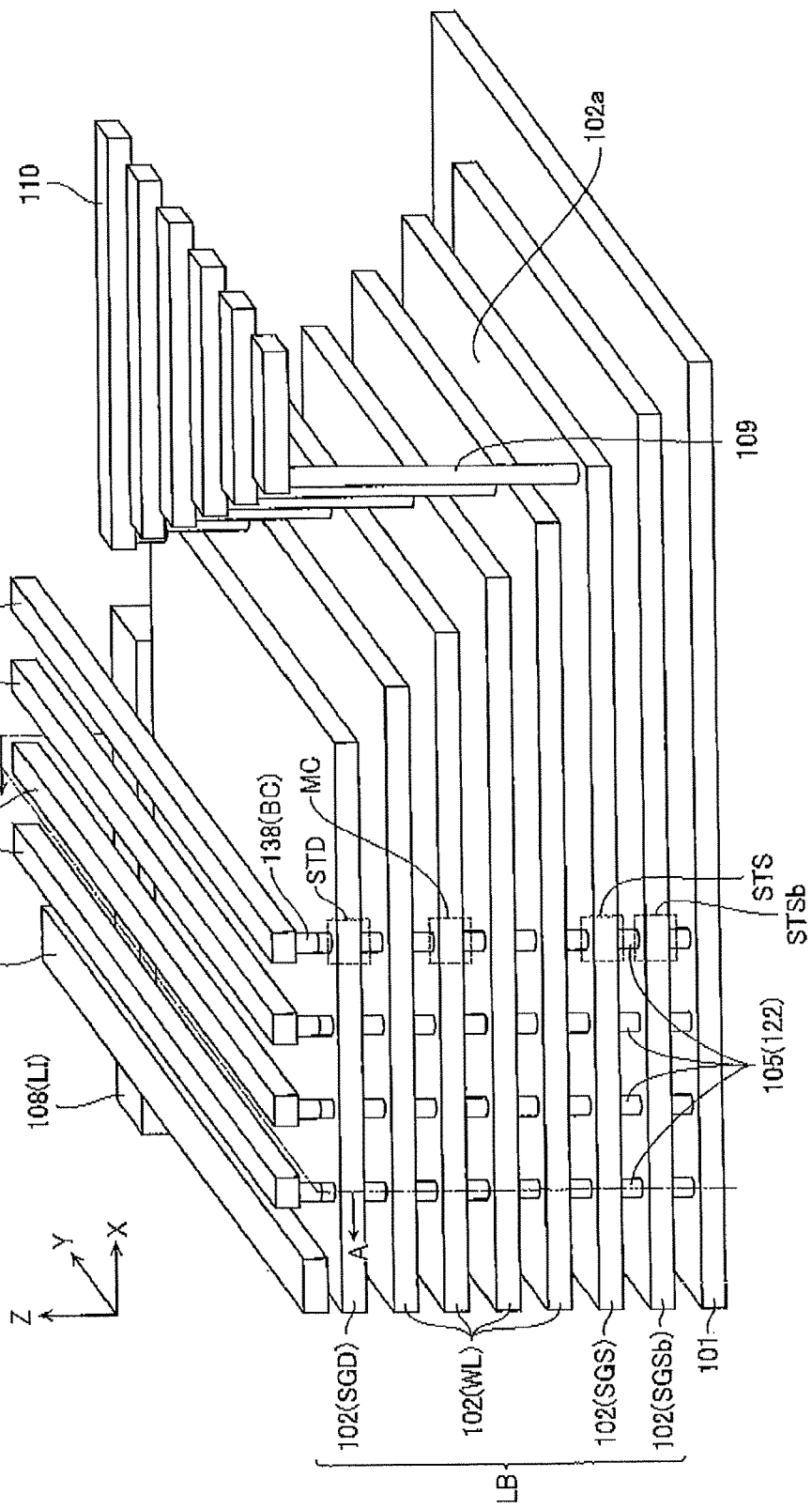
FIG. 3 is a perspective view showing a configuration of part of the same nonvolatile semiconductor memory device.

FIG. 3 is a schematic perspective view showing a configuration of part of the memory finger MF. Note that FIG. 3 explains a three-dimensional structure of a wiring line or the memory cell MC, and so on, and does not illustrate an inter-layer insulating layer provided between the wiring lines, and so on. In addition, FIG. 3 is illustrated for explanation, and a specific configuration may be appropriately changed. Moreover, in the description below, a certain direction parallel to a surface of a substrate 101 is assumed to be an X direction, a direction parallel to the surface of the substrate 101 and perpendicular to the X direction is assumed to be a Y direction, and a direction perpendicular to the surface of the substrate 101 is assumed to be a Z direction. The description below exemplifies the case where a direction in which the memory string MS extends (first direction) matches the Z direction, but the first direction need not match the Z direction. Furthermore, in the description below, a surface of an object facing the substrate 101 is assumed to be a lower surface of the object, and a surface opposite to the lower surface of the object is assumed to be an upper surface. Additionally, a direction approaching the substrate along the first direction is assumed to be downward, and a direction going away from the substrate along the first direction is assumed to be upward. Additionally, an end of an object nearer the substrate 101 than the other end of the object is assumed to a lower end.

The memory finger MF includes: the substrate 101; a stacked body LB provided above the substrate 101; and a substantially circular column-shaped memory columnar body 105 whose side surface is covered by the stacked body LB.

The substrate 101 is a semiconductor substrate configured from the likes of monocrystalline silicon (Si), for example. The substrate 101 comprises a double well structure that includes an N type impurity layer on a surface of a semiconductor substrate and that further includes a P type impurity layer in this N type impurity layer, for example. This P type impurity layer is shown in the drawings. The substrate 101 (P type impurity layer) functions as a channel body of a transistor that has as its control gate electrode a lowermost layer conductive layer 102 in the stacked body LB and that electrically connects the memory columnar body 105 and a conductive layer 108.

The stacked body LB includes a plurality of the conductive layers 102 stacked above the substrate 101. These conductive layers 102 respectively function as the word line WL and control gate electrode of the memory cell MC, or as the select gate lines (SGSb, SGS, and SGD) and control gate electrodes of the select gate transistors (STSb, STS, and STD). The conductive layer 102 is configured from a conductive layer of the likes of tungsten (W), for example. In addition, each of the conductive layers 102 comprises a contact part 102a protruding in the X direction with respect to the conductive layer 102 positioned in a layer above it, and is connected to the row control circuit 3 (FIGS. 1 and 2) via a via contact wiring line 109 connected to a surface of this contact part 102a and via a wiring line 110. Note that the via contact wiring line 109 and the wiring line 110 are configured from a conductive layer of the likes of tungsten (W).

The memory columnar body 105, along with the stacked body LB, configures the memory string MS, and so on. That is, an intersection of the conductive layer 102 and the memory columnar body 105 functions as the memory cell MC or the select gate transistors (STSb, STS, and STD). The memory columnar body 105 includes a substantially circular column-shaped first semiconductor layer 122 extending in the Z direction. The first semiconductor layer 122 faces the plurality of conductive layers 102 and functions as a channel body of the memory cell MC and the select gate transistors (STSb, STS, and STD). A lower end of the first semiconductor layer 122 is connected to the unillustrated source line driver, via the substrate 101, the conductive layer 108 which functions as the source contact LI, and a conductive layer 107 which is provided above the conductive layer 108 and functions as the source line SL. An upper end of the first semiconductor layer 122 is connected to the column control circuit 2 (FIGS. 1 and 2) via a conductive layer 138 which functions as the bit line contact BC and a conductive layer 106 which functions as the bit line BL. Note that the conductive layer 106, the conductive layer 107, the conductive layer 108, and the conductive layer 138 are configured from a conductive layer of the likes of tungsten (W). Moreover, the conductive layer 106 and the conductive layer 107 are arranged in plurality in the X direction and extend in the Y direction. The conductive layer 108 comprises a substantially plate-like shape extending in the X direction and the Z direction along a side surface of the stacked body LB. Moreover, the conductive layer 108 is connected at its lower end to the substrate 101.

Figure 4:
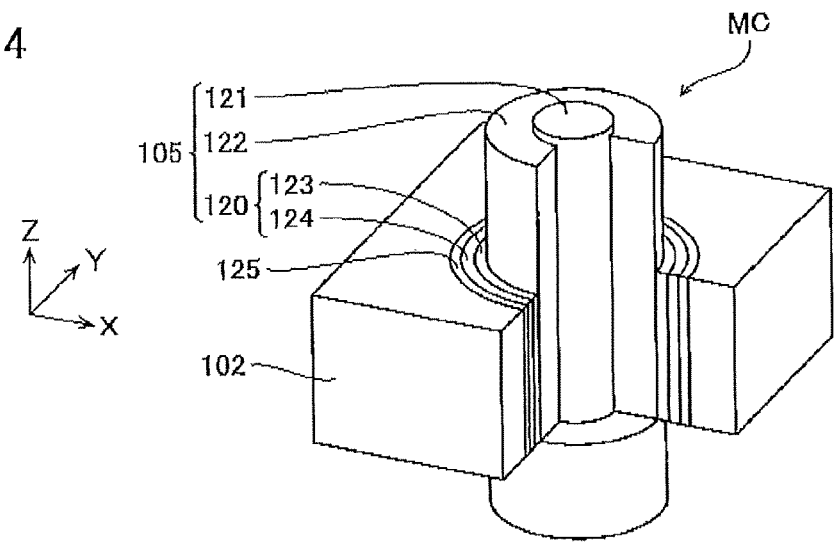
FIG. 4 is a perspective view showing a configuration of part of the same nonvolatile semiconductor memory device.

FIG. 4 is a schematic perspective view showing a configuration of the memory cell MC. Note that FIG. 4 shows the configuration of the memory cell MC, but the select gate transistors (STSb, STS, and STD) may also be configured similarly to the memory cell MC. Note that in FIG. 4, part of the configuration is omitted.

The memory cell MC is provided at an intersection of the conductive layer 102 and the memory columnar body 105. The memory columnar body 105 comprises: a circular column-shaped core insulating layer 121 (first insulating layer) extending in the Z direction; the first semiconductor layer 122 covering a side surface of the core insulating layer 121; and a gate insulating layer 120 covering a side surface of the first semiconductor layer 122. The gate insulating layer 120 comprises: a tunnel insulating layer 123 covering a side surface of the first semiconductor layer 122; and a charge accumulation layer 124 covering a side surface of the tunnel insulating layer 123. In addition, a block insulating layer 125 is provided between the gate insulating layer 120 and the conductive layer 102.

The core insulating layer 121 is configured from an insulating layer of the likes of silicon oxide ($SiO_2$), for example. The first semiconductor layer 122 is configured from a semiconductor layer of the likes of polysilicon, for example, and is formed in a substantially cylindrical shape extending in the Z direction along a side surface of the core insulating layer 121. The gate insulating layer 120 is provided between the conductive layer 102 and the first semiconductor layer 122, and is formed in a substantially cylindrical shape extending in the Z direction along a side surface of the first semiconductor layer 122. The tunnel insulating layer 123 is configured from an insulating layer of the likes of silicon oxide ($SiO_2$), for example. The charge accumulation layer 124 is configured from an insulating layer capable of accumulating a charge, of the likes of silicon nitride ($Si_3N_4$), for example. The block insulating layer 125 is configured from an insulating layer of the likes of silicon oxide ($SiO_2$) or alumina ($Al_2O_3$), for example.

Figure 5:
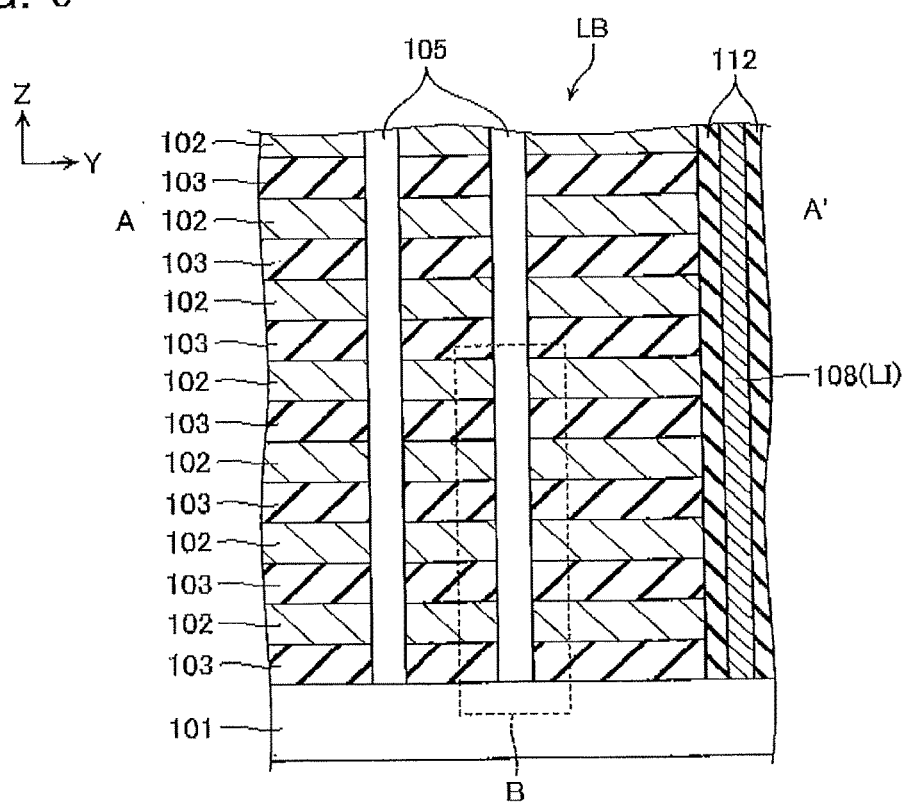
FIG. 5 is a cross-sectional view showing a configuration of part of the same nonvolatile semiconductor memory device.

FIG. 5 is a cross-sectional view of the configuration shown in FIG. 3 cut by a plane including the two dot-chain line in FIG. 3 and viewed along a direction of the arrows A and A'. A and A' in FIG. 5 respectively correspond to positions where the arrows A and A' in FIG. 3 are provided. However, in FIG. 5, illustration of the conductive layer 106 and the conductive layer 138 is omitted. Moreover, FIG. 5 illustrates the two memory columnar bodies 105 most closely adjacent to the source contact LI. Note that FIG. 5 is illustrated for explanation, and a specific configuration may be appropriately changed.

Although omitted in FIG. 3 for convenience of explanation, an inter-layer insulating layer 103 is provided between the conductive layers 102. The inter-layer insulating layer 103 is configured from an insulating layer of the likes of silicon oxide ($SiO_2$), and secures insulation between the conductive layers 102. Moreover, although omitted in FIG. 3, a spacer insulating layer 112 is provided between the conductive layer 102 and the conductive layer 108. The spacer insulating layer 112 is configured from an insulating layer of the likes of silicon oxide ($SiO_2$), and secures insulation between the conductive layer 102 and the conductive layer 108.

Figure 6:
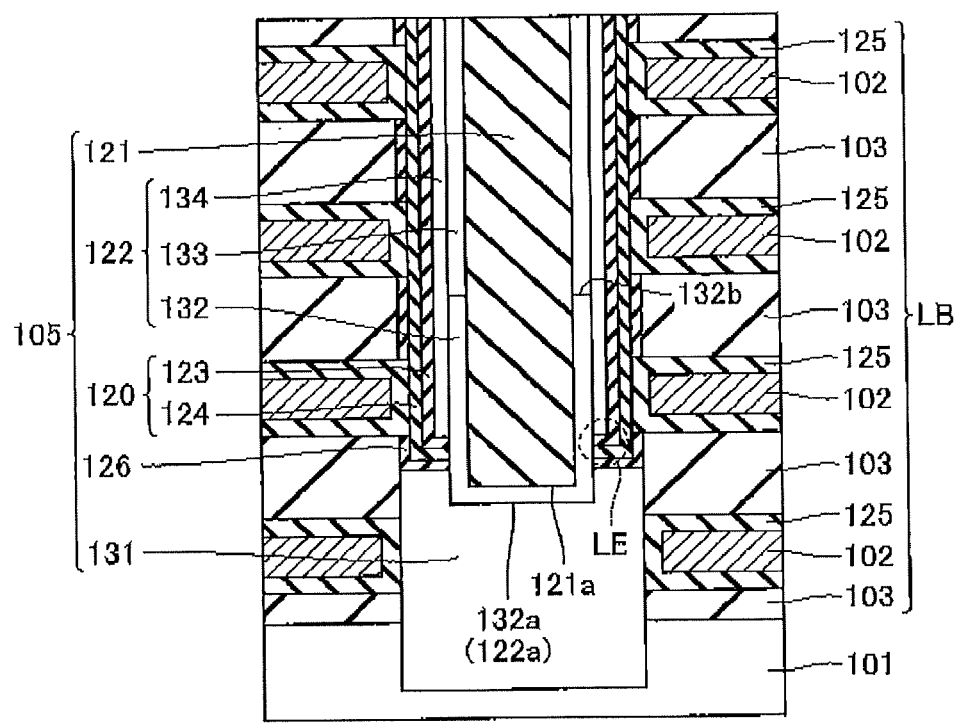
FIG. 6 is a cross-sectional view showing a configuration of part of the same nonvolatile semiconductor memory device.

FIG. 6 is an enlarged view of a portion indicated by B of FIG. 5. However, FIG. 6 illustrates the block insulating layer 125 and a cover insulating layer 126 which were omitted in FIG. 5. Note that FIG. 6 is illustrated for explanation, and a specific configuration may be appropriately changed.

The memory columnar body 105, in addition to comprising the core insulating layer 121, the first semiconductor layer 122, the gate insulating layer 120, and the cover insulating layer 126 that protects the gate insulating layer 120 during a manufacturing step which were described with reference to FIG. 4, comprises also a second semiconductor layer 131 positioned downwardly of these and connected to a lower end 122a of the first semiconductor layer 122. The second semiconductor layer 131 is a semiconductor layer such as a silicon layer which is formed by the likes of an epitaxial growth method and which, along with the substrate 101, configures a monocrystal, for example. The second semiconductor layer 131 reduces an electrical resistance value between the substrate 101 and the first semiconductor layer 122.

Now, the first semiconductor layer 122 according to the present embodiment comprises: a first portion 132 contacting an upper surface of the second semiconductor layer 131; a second portion 133 connected to an upper end 132b of this first portion 132 and extending in the Z direction; and a third portion 134 covering side surfaces of the first portion 132 and the second portion 133. The first portion 132 has its lower end 132a positioned more downwardly than a lower end LE of the gate insulating layer 120 is, and its upper end 132b positioned above the lower end LE of the gate insulating layer 120 is, and covers a lower end 121a of the core insulating layer 121. The second portion 133 covers a side surface of the core insulating layer 121. The third portion 134 is provided between the first portion 132 and the gate insulating layers 120, and between the second portion 133 and the gate insulating layers 120, and extends in the Z direction along the side surfaces of the first portion 132 and the second portion 133.

A crystalline structure of the second portion 133 is different from a crystalline structure of the first portion 132. For example, the second portion 133 is formed from silicon having a so-called polycrystalline structure (polycrystalline silicon, polysilicon). In contrast, the first portion 132 is a so-called solid phase growth layer and has a crystalline structure closer to a monocrystal than that of the second portion 133 is. Moreover, a crystal orientation in the first portion 132 is aligned with a crystal orientation in the second semiconductor layer 131 and the substrate 101.

Such a configuration is manufactured as follows, for example. The second semiconductor layer 131 is formed by the likes of an epitaxial growth method adopting as a nucleus the crystalline structure of the substrate 101 configured from monocrystalline silicon, for example. As a result, the second semiconductor layer 131 has a monocrystalline structure and has its crystal orientation aligned with that of the substrate 101. The first portion 132 of the first semiconductor layer 122 is formed by, for example, depositing silicon in an amorphous state and, by heat treatment or the like, stimulating solid phase growth adopting as a nucleus the crystalline structure of the second semiconductor layer 131. As a result, the first portion 132 of the first semiconductor layer 122 has a crystalline structure close to a monocrystal and has its crystal orientation aligned with that of the substrate 101.

In such a configuration, the crystalline structure in the lower end 122a of the first semiconductor layer 122 and the crystalline structure in the second semiconductor layer 131 are aligned, hence a resistance value at a contact interface of the first semiconductor layer 122 and the second semiconductor layer 131 can be lowered. This makes it possible to increase a current flowing in the first semiconductor layer 122 where a channel of the likes of the memory cell MC is formed.

Moreover, in such a configuration, the first portion 132 of the first semiconductor layer 122 contacts the upper surface of the second semiconductor layer 131 at a position more downward than the lower end LE of the gate insulating layer 120. Therefore, the contact interface of the second semiconductor layer 131 and the first semiconductor layer 122 is provided at a comparatively deep position in the second semiconductor layer 131 and has a good crystal surface with few defects or little contamination, and so on. Therefore, a contact resistance of the first semiconductor layer 122 and the second semiconductor layer 131 contacting this surface can be further lowered. Note that in the present embodiment, not only a lower end 132a of the first portion 132, but also the lower end 121a of the core insulating layer 121 (first insulating layer) is positioned more downwardly than the lower end LE of the gate insulating layer 120 is.

Note that the second portion 133 of the first semiconductor layer 122 is configured from polycrystalline silicon, and the first portion 132 is a solid phase growth layer. Therefore, a size of a crystal grain in the first portion 132 is at least larger than a size of a crystal grain in the second portion 133. Moreover, there are fewer trap sites of an impurity or the like in the first portion 132 than trap sites in the second portion 133. Moreover, the first portion 132 may be a monocrystalline layer. Moreover, the third portion 134 is mainly configured from polycrystalline silicon, for example. However, for example, the likes of a portion contacting the first portion 132 of the third portion 134 may be formed from a solid phase growth layer, similarly to the first portion 132.

[Method of Manufacturing]

Figure 7:
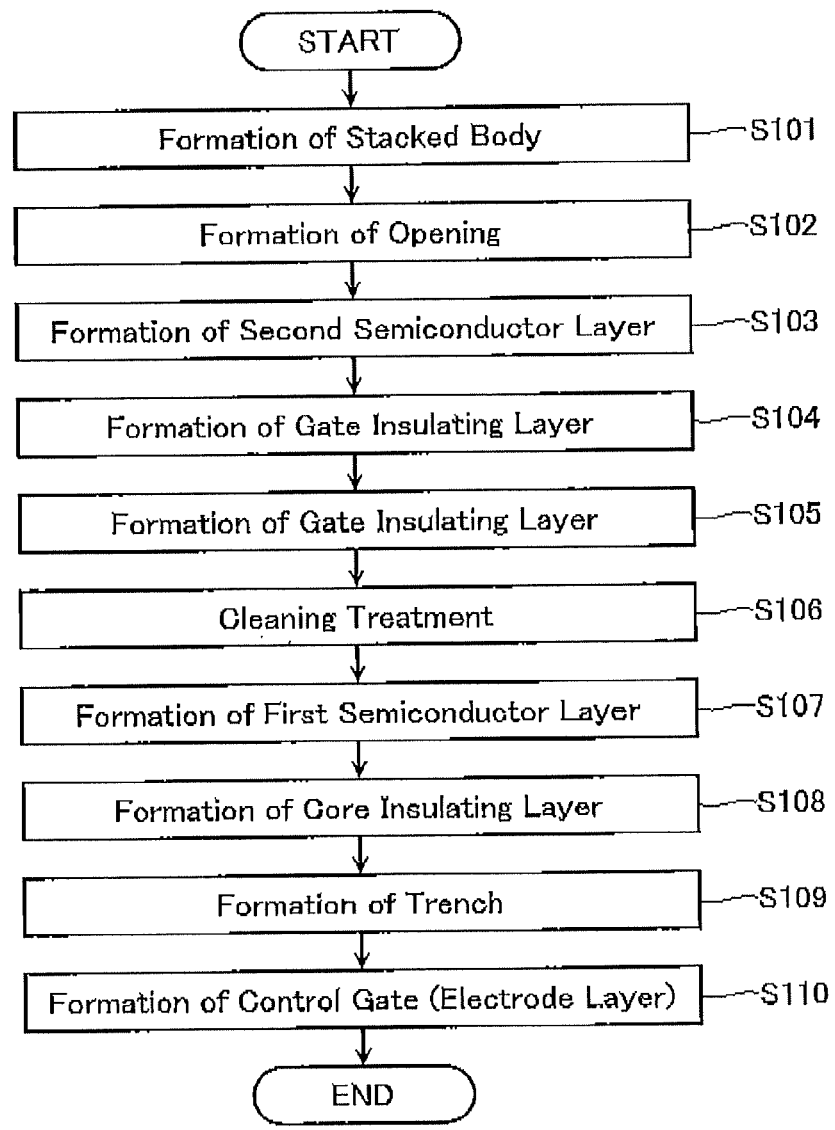
FIG. 7 is a flowchart for explaining a method of manufacturing the same nonvolatile semiconductor memory device.

FIG. 7 is a flowchart for explaining a method of manufacturing according to the first embodiment. FIGS. 8 to 19 are cross-sectional views for explaining the same method of manufacturing a nonvolatile semiconductor memory device. Note that FIGS. 8 to 19 are cross-sectional views corresponding to FIG. 5 or FIG. 6.

Figure 8:
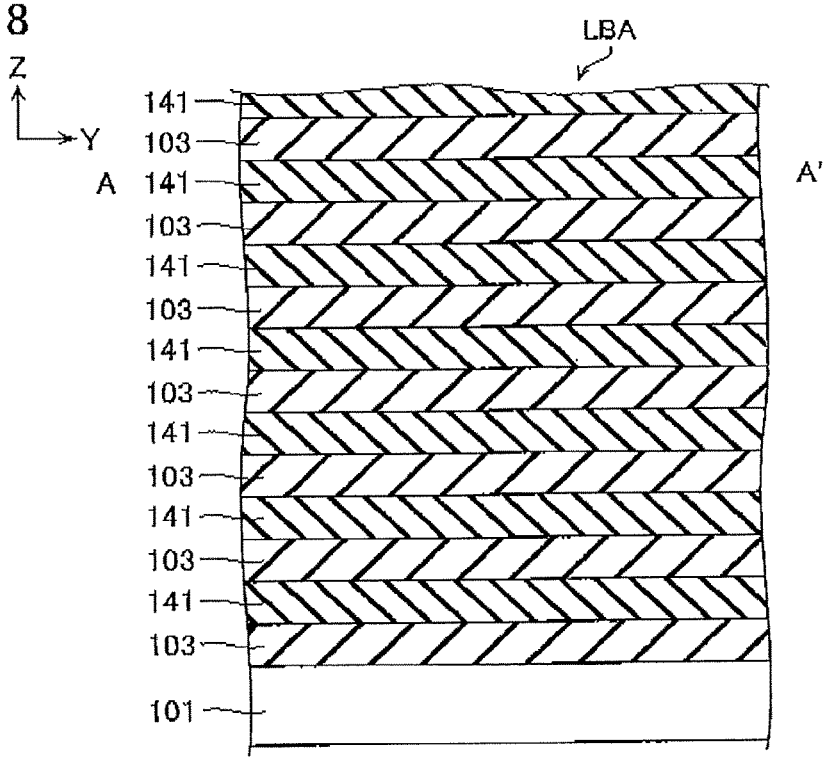
FIGS. 8 to 19 are cross-sectional views for explaining the same method of manufacturing.

As shown in FIGS. 7 and 8, in step S101, a stacked body LBA that includes a plurality of the inter-layer insulating layers 103 and sacrifice layers 141 (first layers) is formed above the substrate 101. The inter-layer insulating layer 103 is formed by depositing an insulating layer of the likes of silicon oxide ($SiO_2$), by a method such as CVD (Chemical Vapor Deposition), for example. The sacrifice layer 141 is formed by depositing the likes of silicon nitride ($Si_3N_4$) by a method such as CVD, for example.

Figure 9:
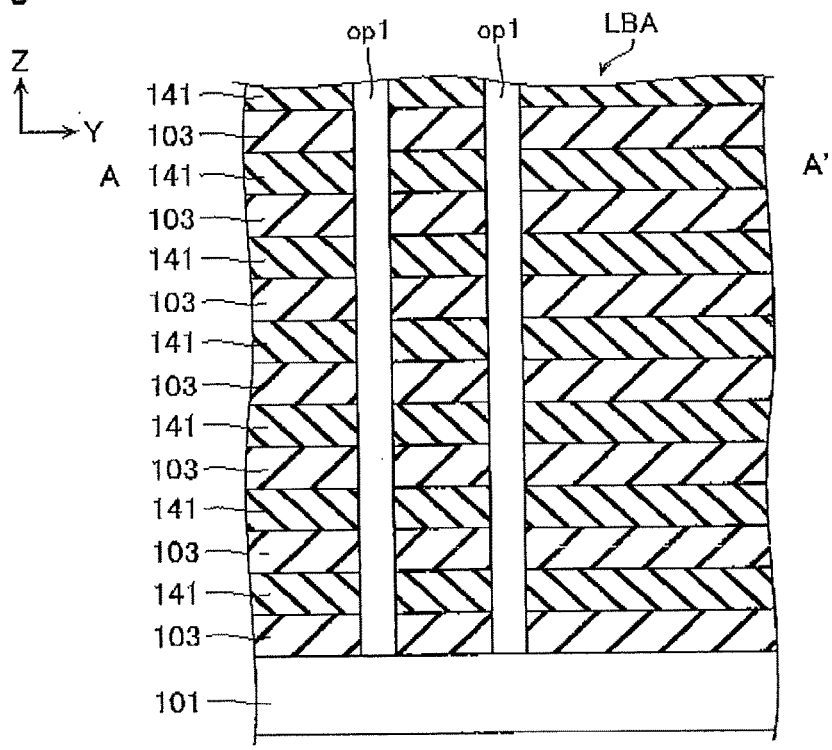
Figure 10:
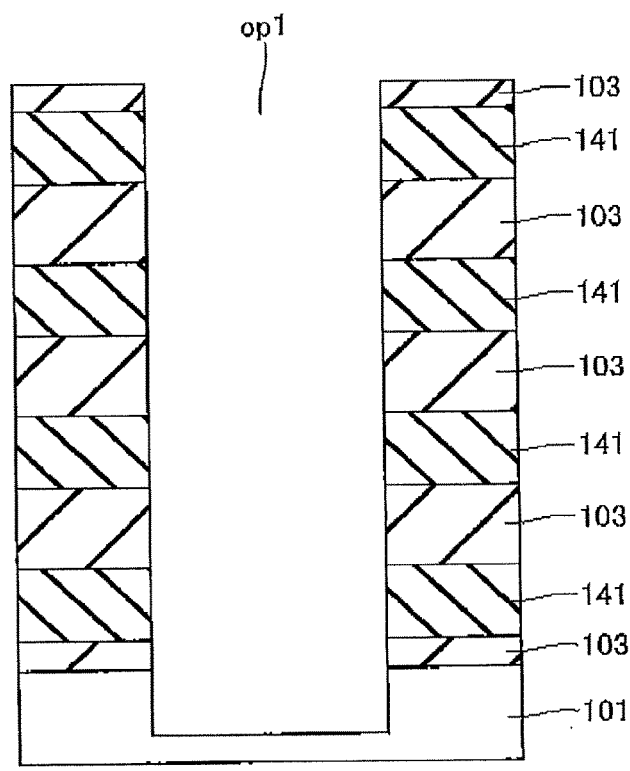

As shown in FIGS. 7, 9, and 10, in step S102, an opening op1 (first opening) is formed in the stacked body LBA. The opening op1 is a through hole that extends in the Z direction and penetrates the plurality of inter-layer insulating layers 103 and sacrifice layers 141 stacked on the substrate 101 to expose an upper surface of the substrate 101. The opening op1 is formed by a means such as RIE (Reactive Ion Etching), for example.

Figure 11:
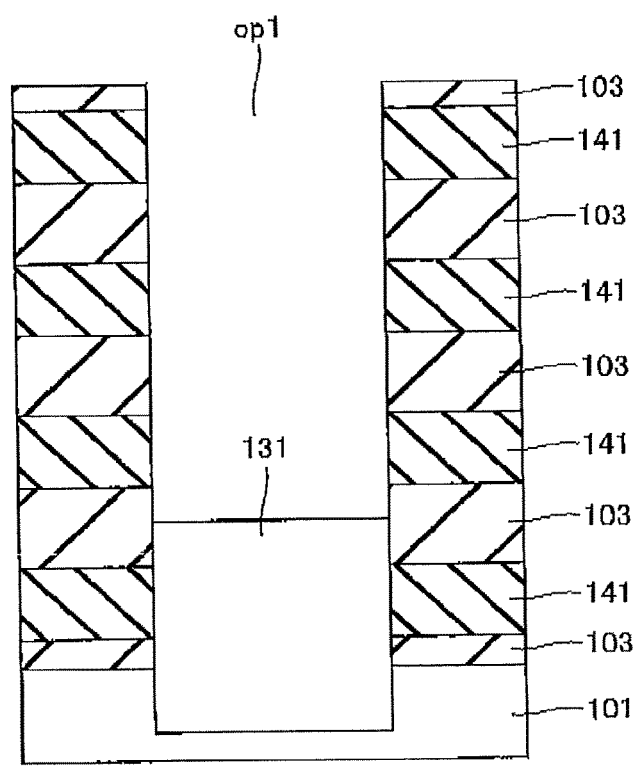

As shown in FIGS. 7 and 11, in step S103, the second semiconductor layer 131 is formed by a crystal growth method, in a bottom part of the opening op1. The second semiconductor layer 131 is formed by a crystal growth method such as an epitaxial growth method, for example. The second semiconductor layer 131 is formed from a semiconductor layer of the likes of silicon (Si), for example. Moreover, a crystal orientation in the second semiconductor layer 131 is aligned with a crystal orientation in the substrate 101. Note that before forming the second semiconductor layer 131, a cleaning treatment may be performed on the upper surface of the substrate 101.

Figure 12:
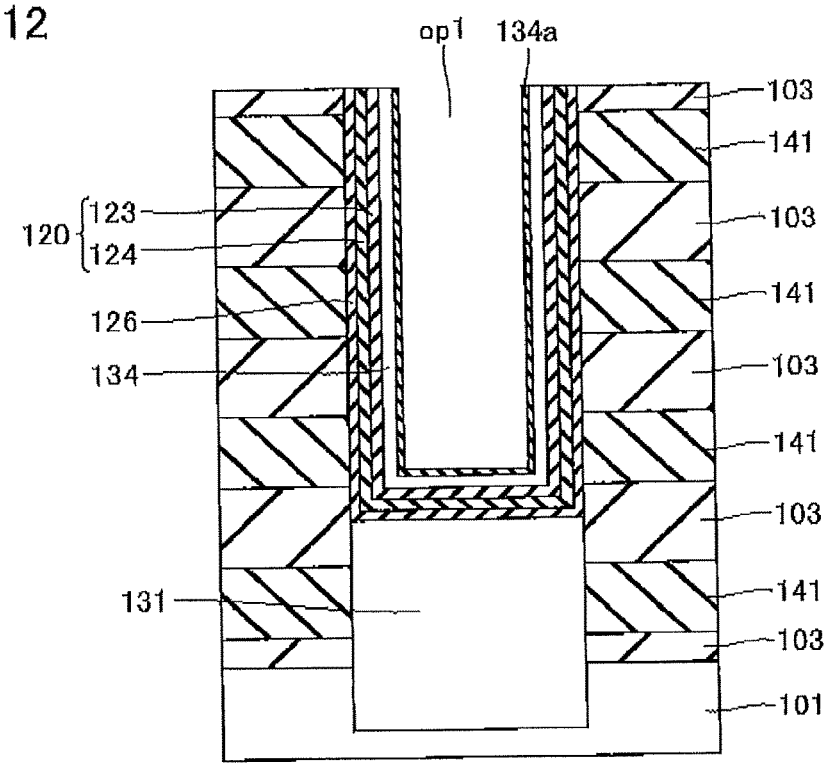

As shown in FIGS. 7 and 12, in step S104, the cover insulating layer 126, the gate insulating layer 120 (charge accumulation layer 124 and tunnel insulating layer 123), the third portion 134 of the first semiconductor layer 122, and a cover insulating layer 134a are formed on a bottom surface and side surface of the opening op1. The cover insulating layer 126, the tunnel insulating layer 123, and the cover insulating layer 134a are configured from an insulating layer of the likes of silicon oxide ($SiO_2$). The charge accumulation layer 124 is configured from a layer capable of accumulating a charge, of the likes of silicon nitride ($Si_2N_4$). The third portion 134 of the first semiconductor layer 122 is configured from a semiconductor layer of the likes of amorphous silicon, for example. Note that a crystalline structure of silicon in this third portion 134 undergoes transition from an amorphous state to a polycrystalline structure by heat treatment or the like. Moreover, forming of the above-described semiconductor layer of the likes of amorphous silicon is performed by a method such as CVD, for example.

Figure 13:
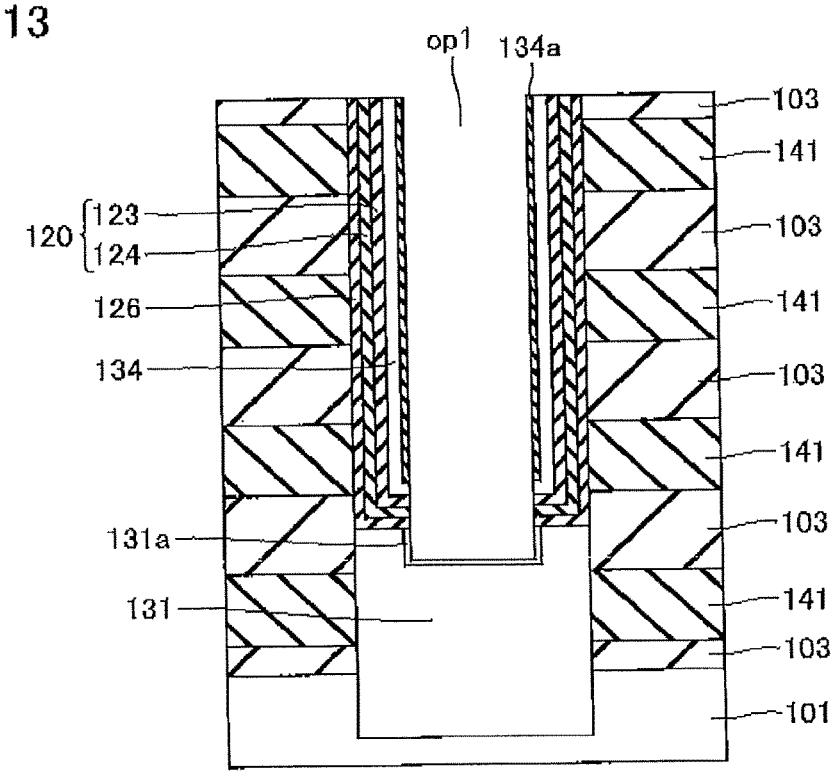

As shown in FIGS. 7 and 13, in step S105, portions covering the bottom surface of the opening op1, of the cover insulating layer 126, the gate insulating layer 120, the third portion 134 of the first semiconductor layer 122, and the cover insulating layer 134a are removed, and an upper surface of the second semiconductor layer 131 is exposed. This step is performed by a means such as RIE. Moreover, in this step, part of the second semiconductor layer 131 is removed. Note that in this step, a damage layer 131a is formed in an upper surface portion exposed in the opening op1 of the second semiconductor layer 131. The damage layer 131a is the upper surface portion of the second semiconductor layer 131 and is a portion where the crystalline structure has become disordered when part of the second semiconductor layer 131 is removed.

Figure 14:
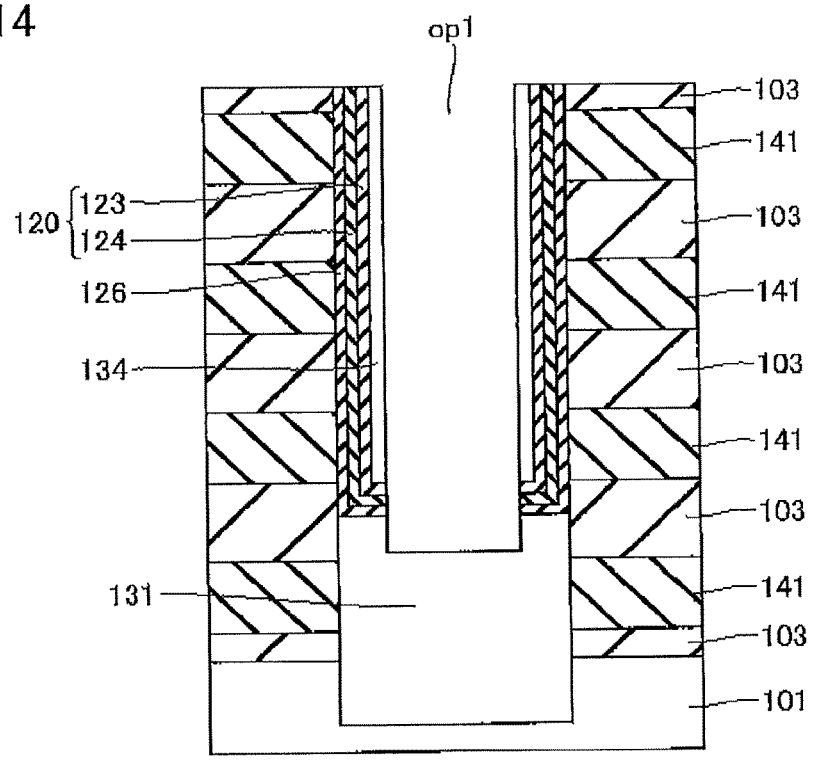

As shown in FIGS. 7 and 14, in step S106, a cleaning treatment is performed inside the opening op1, and the damage layer 131a and cover insulating layer 134a are removed. As a result, crystal surfaces of the second semiconductor layer 131 and the third portion 134 of the first semiconductor layer 122 are exposed inside the opening op1. This cleaning treatment may be performed employing a gas of a chlorine ($Cl_2$) system or a fluorocarbon system such as $CF_4$, for example. Moreover, this cleaning treatment may also be performed combining these gases.

Figure 15:
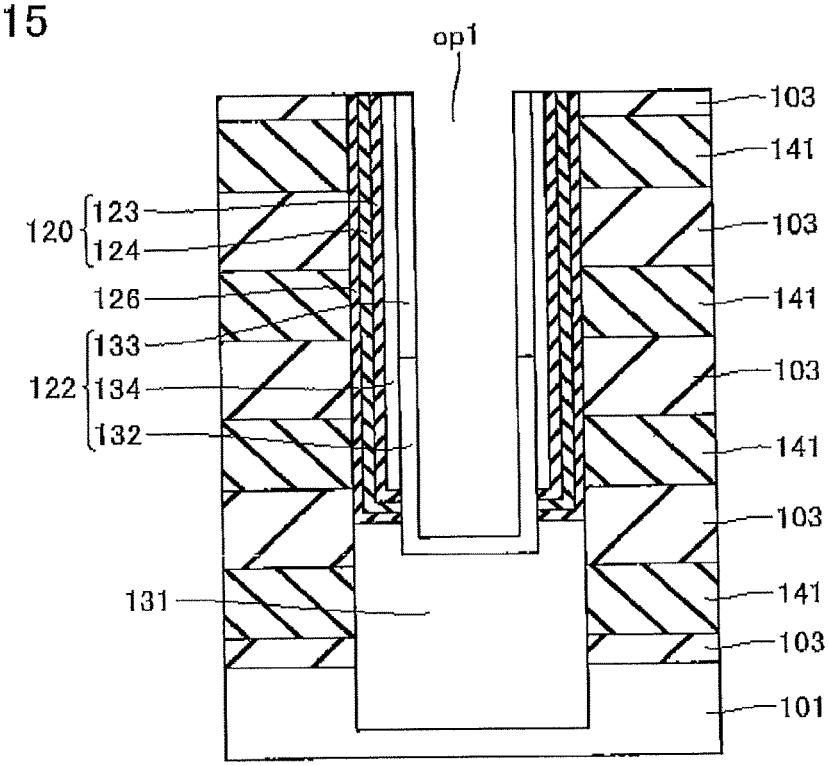

As shown in FIGS. 7 and 15, in step S107, first, silicon or the like is formed inside the opening op1 (on a side surface and bottom part of the opening op1 (upper surface of the second semiconductor layer 131)) by a method such as CVD, for example. Temperature during forming is set to about 400° C. to 600° C., for example.

In a state immediately after forming, the silicon formed on the side surface (that is, a sidewall of the third portion 134) and bottom part of the opening op1 is mainly in an amorphous state. This amorphous state silicon is reformed by heat treatment or the like. As a result, in a main part excluding an opening bottom part of the above-described side surface of the opening op1, amorphous state silicon undergoes transition to a polycrystalline structure, and the second portion 133 of the first semiconductor layer 122 is formed.

On the other hand, at the upper surface of the second semiconductor layer 131 which has a similar crystallinity to that of the substrate 101, the silicon formed on the bottom part of the opening op1, that is, a second semiconductor layer 131 upper surface, undergoes solid phase growth matching the crystallinity to the second semiconductor layer 131. Additionally, the silicon formed on the bottom part of the opening op1 becomes a crystalline layer (solid phase growth layer), and the first portion 132 of the first semiconductor layer 122 is formed. This solid phase growth layer takes in also part of the silicon formed on the side surface of the opening op1, that is, the sidewall of the third portion 134 of the first semiconductor layer 122, and grows directed upwardly. Note that the first portion 132 (solid phase growth layer) of the first semiconductor layer 122 sometimes also grows directed into the third portion 134. In this case, part of the third portion 134 also becomes a solid phase growth layer. In this way, formation of the first portion 132 becoming the solid phase growth layer is controllable by a film thickness and formation conditions (deposition conditions) or heat treatment temperature and time of a semiconductor layer of amorphous silicon, and so on.

Figure 16:
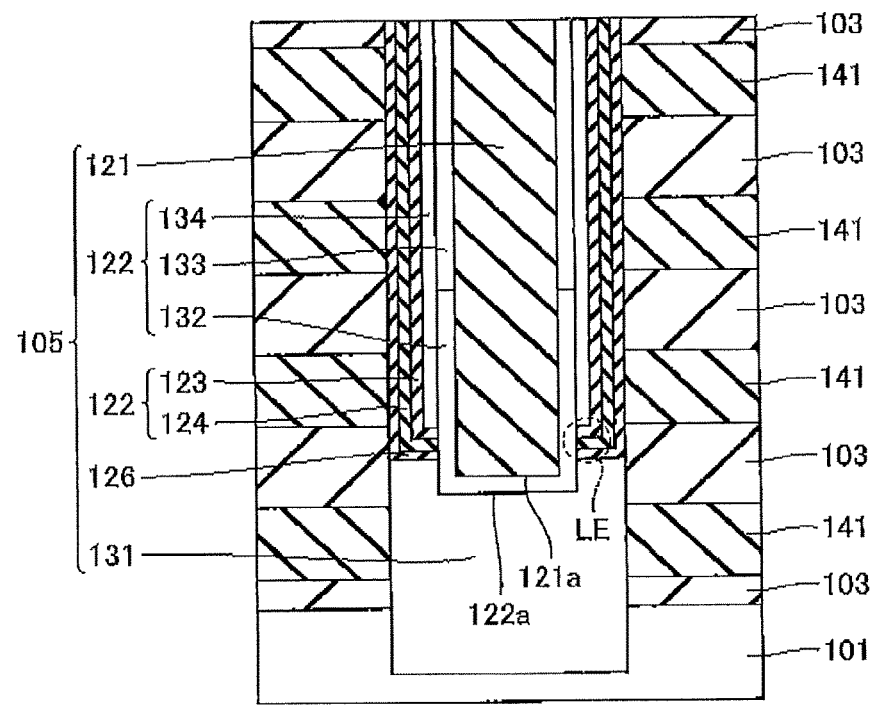
Figure 17:
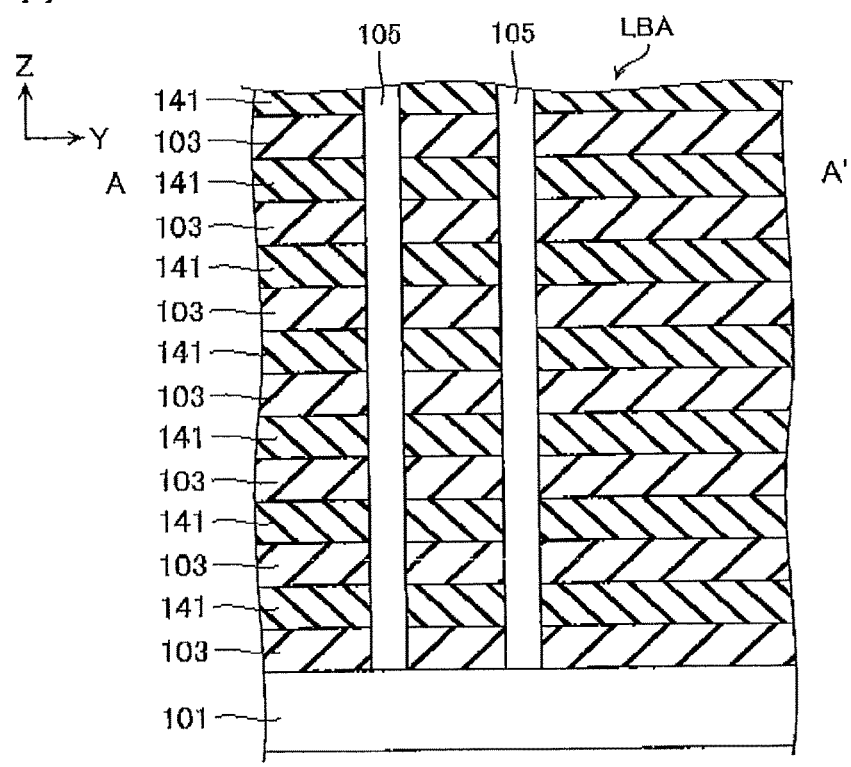

As shown in FIGS. 7 and 16, in step S108, the core insulating layer 121 is formed. The core insulating layer 121 is formed by implanting the likes of silicon oxide ($SiO_2$) inside the opening op1, for example. As a result, the memory columnar body 105 is formed as shown in FIG. 17.

Figure 18:
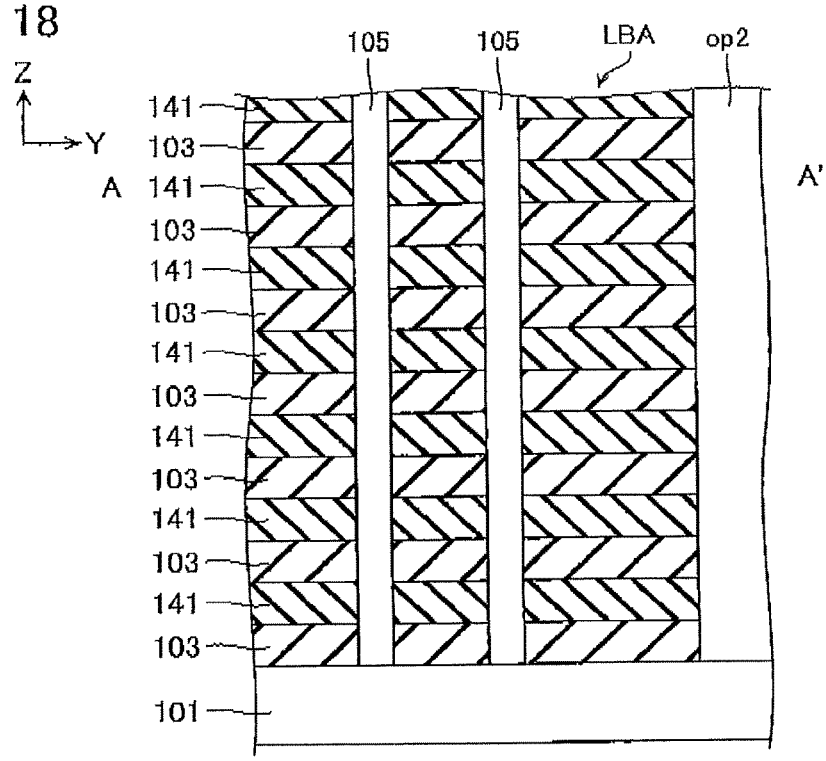

As shown in FIGS. 7 and 18, in step S109, a trench op2 (second opening) is formed. The trench op2 is a trench that extends in the Z direction and the X direction and penetrates the plurality of inter-layer insulating layers 103 and sacrifice layers 141 stacked on the substrate 101 to expose the upper surface of the substrate 101, for example. The trench op2 is formed by a means such as RIE, for example.

Figure 19:
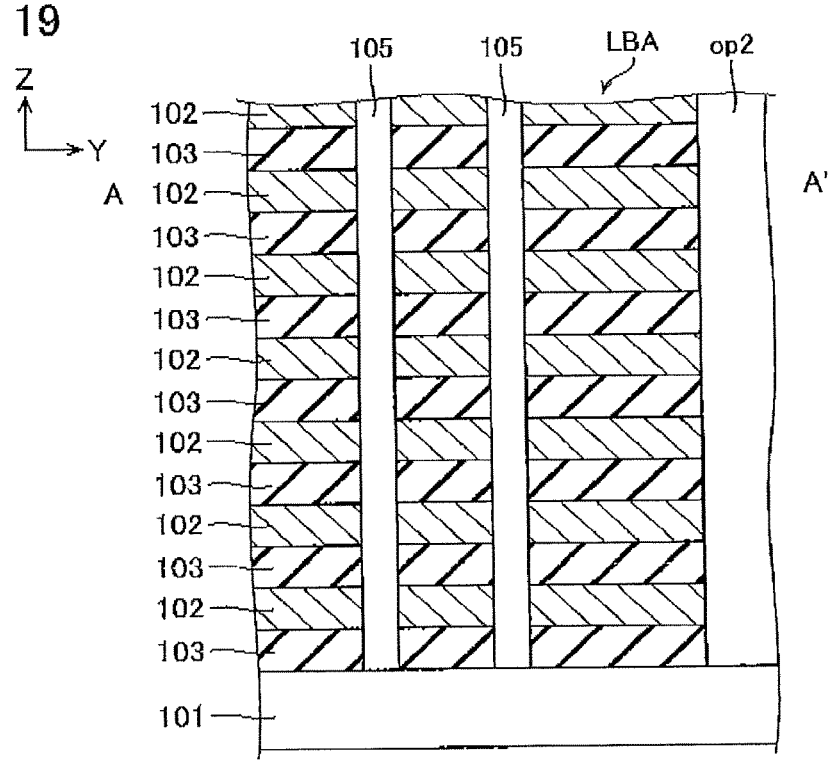

As shown in FIGS. 7, 19, and 6, in step S110, the conductive layer 102 functioning as the control gate of the memory cell MC, and so on, is formed. For example, the sacrifice layer 141 is removed and part of the cover insulating layer 126 is removed, via the trench op2. In addition, the block insulating layer 125 and the conductive layer 102 are formed on an upper surface, lower surface, and side surface of the inter-layer insulating layer 103, via the trench op2. The sacrifice layer 141 is removed by the likes of wet etching using phosphoric acid. The block insulating layer 125 is formed by depositing the likes of silicon oxide ($SiO_2$) by a means such as CVD, for example. The conductive layer 102 is formed by depositing the likes of tungsten (W) by a means such as CVD, for example.

Subsequently, as shown in the likes of FIG. 5, the spacer insulating layer 112 and the conductive layer 108 functioning as the source contact LI are formed inside the opening op2, whereby the nonvolatile semiconductor memory device described with reference to FIGS. 5 and 6 is formed.

In such a method of manufacturing, as described with reference to FIG. 14, a cleaning treatment is performed inside the opening op1, the damage layer 131a is removed, and the crystal surface of the second semiconductor layer 131 is exposed. Therefore, as described with reference to FIG. 15, by forming a semiconductor layer configuring the first semiconductor layer 122 on this exposed crystal surface, solid phase growth of the semiconductor layer can be stimulated to form a solid phase growth layer (first portion 132 of the first semiconductor layer 122).

Moreover, in such a method of manufacturing, as described with reference to FIG. 13, part of the second semiconductor layer 131 is removed. Therefore, even when, for example, crystallinity of the upper surface of the second semiconductor layer 131 has become disordered or the upper surface of the second semiconductor layer 131 has been contaminated, such an upper surface portion can be removed to expose a good crystal surface with few defects or little contamination, and so on. Therefore, as described with reference to FIG. 15, forming the semiconductor layer herein makes it possible to form a solid phase growth layer having good crystallinity. Note that in the present embodiment, part of the second semiconductor layer 131 is removed to an extent that the lower end 121a of the core insulating layer 121 and the lower end 122a of the first semiconductor layer 122 are positioned more downwardly than the lower end LE of the gate insulating layer 120 is.

Other Embodiments

As described with reference to FIG. 3, the lower end of the memory columnar body 105 according to the first embodiment is connected to the conductive layer 108 via the substrate 101. However, the lower end of the memory columnar body 105 may be connected to the conductive layer 108 via a semiconductor layer other than the substrate 101. In addition, as described with reference to FIG. 6, the memory columnar body 105 according to the first embodiment comprises the second semiconductor layer 131 that contacts the lower end of the first semiconductor layer 122. However, it is also possible, for example, to omit the second semiconductor layer 131 of the kind described with reference to FIG. 6 and connect the lower end of the first semiconductor layer 122 directly to the substrate 101 or the above-described semiconductor layer other than the substrate 101. In other words, it is also possible for the substrate 101 or the above-described semiconductor layer other than the substrate 101 to be adopted as the second semiconductor layer. In such a case, the first portion 132 of the first semiconductor layer 122 can be formed by stimulating solid phase growth adopting as a nucleus the crystal surfaces of these substrate 101 or semiconductor layer other than the substrate 101.

Figure 20:
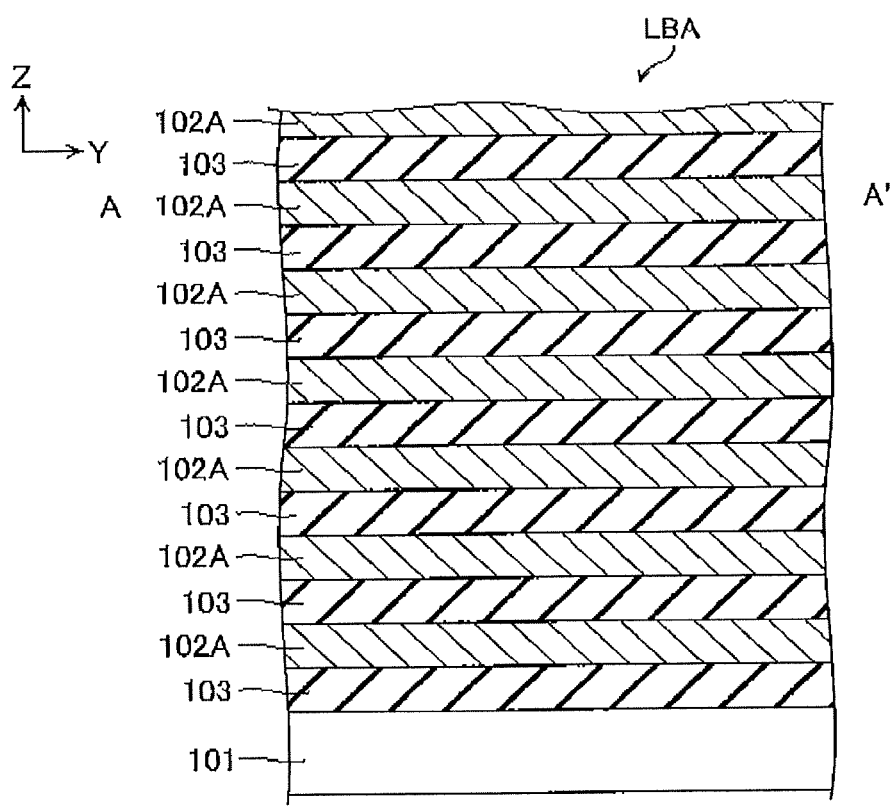
FIG. 20 is a cross-sectional view for explaining another method of manufacturing a nonvolatile semiconductor memory device according to an embodiment.

Moreover, as described with reference to FIG. 8, in the method of manufacturing according to the first embodiment, the stacked body LBA including the plurality of inter-layer insulating layers 103 and sacrifice layers 141 (first layers) is formed on the substrate 101. However, instead of the sacrifice layer 141, as shown in FIG. 20, a conductive layer 102A of the likes of polysilicon or tungsten may be formed as the first layer. In this case, as shown in FIG. 19, the conductive layers 102 can be formed by forming the trench op2 to divide the first layers (the conductive layers 102A).

[Others]

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
   a plurality of control gate electrodes stacked above a substrate;

a first semiconductor layer extending in a first direction above the substrate and facing the plurality of control gate electrodes;

a gate insulating layer extending in the first direction and provided between the control gate electrodes and the first semiconductor layer; and a second semiconductor layer positioned downwardly of the first semiconductor layer and the gate insulating layer, the second semiconductor layer being connected to a lower end of the first semiconductor layer and the substrate, wherein the first semiconductor layer comprising:

a first portion contacting an upper surface of the second semiconductor layer at a position more downward than a lower end of the gate insulating layer; and a second portion which is connected to an upper end of the first portion, extends in the first direction and has a crystalline structure different from that of the first portion.

2. The semiconductor memory device according to claim 1, wherein the first portion of the first semiconductor layer is a monocrystalline layer, and the second portion of the first semiconductor layer is configured from polycrystalline silicon.

3. The semiconductor memory device according to claim 1, wherein a crystal orientation of the first portion of the first semiconductor layer is aligned with a crystal orientation of the second semiconductor layer.

4. The semiconductor memory device according to claim 1, wherein a size of a crystal grain in the first portion of the first semiconductor layer is larger than a size of a crystal grain in the second portion.

5. The semiconductor memory device according to claim 1, wherein the upper end of the first portion of the first semiconductor layer is positioned above the lower end of the gate insulating layer.

6. The semiconductor memory device according to claim 1, wherein the first semiconductor layer further comprises a third portion provided between the first portion and the control gate electrodes and between the second portion and the control gate electrodes.

7. The semiconductor memory device according to claim 1, further comprising a first insulating layer whose side surface is covered by the first semiconductor layer, wherein the first portion covers a lower end of the first insulating layer, and the second portion covers a side surface of the first insulating layer.

8. The semiconductor memory device according to claim 1, further comprising a first insulating layer whose side surface is covered by the first semiconductor layer, wherein a lower end of the first insulating layer is positioned more downwardly than the lower end of the gate insulating layer.

* * * * *